United States Patent
Yu et al.

(10) Patent No.: US 7,465,994 B2
(45) Date of Patent: Dec. 16, 2008

(54) LAYOUT STRUCTURE FOR ESD PROTECTION CIRCUITS

(75) Inventors: Kuo-Feng Yu, Hsin-Chu (TW); Jian-Hsing Lee, Hsin-Chu (TW); Yi-Hsun Wu, Hsin-Chu (TW); C.S Tang, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 116 days.

(21) Appl. No.: 11/512,850

(22) Filed: Aug. 29, 2006

(65) Prior Publication Data

US 2006/0289935 A1    Dec. 28, 2006

Related U.S. Application Data

(63) Continuation-in-part of application No. 11/157,200, filed on Jun. 17, 2005, now abandoned.

(51) Int. Cl.
   *H01L 23/62*   (2006.01)
(52) U.S. Cl. ............... 257/360; 257/361; 257/E27.016
(58) Field of Classification Search ................ 257/360, 257/361, E27.016
See application file for complete search history.

(56) References Cited

U.S. PATENT DOCUMENTS

| | | | |
|---|---|---|---|
| 2006/0097322 A1* | 5/2006 | Kwak et al. | 257/355 |
| 2006/0157791 A1* | 7/2006 | Lee et al. | 257/357 |
| 2006/0249792 A1* | 11/2006 | Kim et al. | 257/355 |
| 2007/0034956 A1* | 2/2007 | Lee et al. | 257/355 |
| 2007/0181948 A1* | 8/2007 | Liaw et al. | 257/355 |
| 2007/0241407 A1* | 10/2007 | Kim et al. | 257/371 |
| 2008/0023767 A1* | 1/2008 | Voldman | 257/355 |

* cited by examiner

*Primary Examiner*—Ngan Ngo
(74) *Attorney, Agent, or Firm*—K & L Gates LLP

(57) ABSTRACT

A layout structure for an ESD protection circuit includes a first MOS device area having a first and second doped regions of the same polarity disposed at two sides of a first conductive gate layer, and a third doped region disposed along the first doped region at one side of the first conductive gate layer. The third doped region has a polarity different from that of the first and second doped regions, such that the third doped region and the second doped region form a diode for enhancing dissipation of ESD current during a negative ESD event.

18 Claims, 5 Drawing Sheets

LAYOUT STRUCTURE FOR ESD PROTECTION CIRCUITS

CROSS REFERENCE

This is a continuation-in-part application of prior application Ser. No. 11/157,200, filed Jun. 17, 2005 now abandoned.

BACKGROUND

The present invention relates generally to an integrated circuit (IC) design, and more particularly to a layout design for an electrostatic discharge (ESD) protection circuit.

A gate oxide of a metal-oxide-semiconductor (MOS) device of an IC is most susceptible to damage caused by ESD. The gate oxide may be destroyed by being contacted with a voltage only a few volts higher than a supply voltage of the IC. Electrostatic voltages from common environmental sources can easily reach thousands, or even tens of thousands of volts. Such voltages are destructive even though the charge and any resulting current are extremely small. For this reason, an ESD protection circuit is often implemented along with other core circuits in an IC in order to discharge any static electric charge, before it damages the IC.

Silicon-on-insulator (SOI) technology becomes more and more popular for low-voltage, high-speed applications because of its advantages over bulk-silicon technology, such as latch-up immunity and smaller junction capacitance. A diode is a conventional ESD protection device used in the SOI technology. The diode is one of the powerful devices used for on-chip ESD protection due to its low trigger voltage, low turn-on resistance, and high ESD robustness. However, this conventional diode alone does not provide an adequate protection against ESD charges.

Another conventional device often used for ESD protection against the ESD charges is the grounded-gate NMOS (GGNMOS) device constructed by using SOI technology. The GGNMOS device is featured by having a poly-silicon gate layer connected to ground. However, the GGNMOS does not provide adequate ESD protection against negative ESD charges.

Therefore, desirable in the art of the ESD protection circuit in SOI technology are layout structures for ESD protection circuits that provide adequate protection against both the positive and negative ESD charges.

SUMMARY

The present invention discloses a layout structure for an ESD protection circuit. In one embodiment of the invention, the layout structure includes a first MOS device area having a first and second doped region of the same polarity disposed at two sides of a first conductive gate layer, and a third doped region disposed along the first doped region at one side of the first conductive gate layer. The third doped region has a polarity different from that of the first and second doped regions, such that the third doped region and the second doped region form a diode for enhancing dissipation of ESD current during a negative ESD event.

The construction and method of operation of the invention, however, together with additional objects and advantages thereof will be best understood from the following description of specific embodiments when read in connection with the accompanying drawings.

DESCRIPTION

Figure 1:
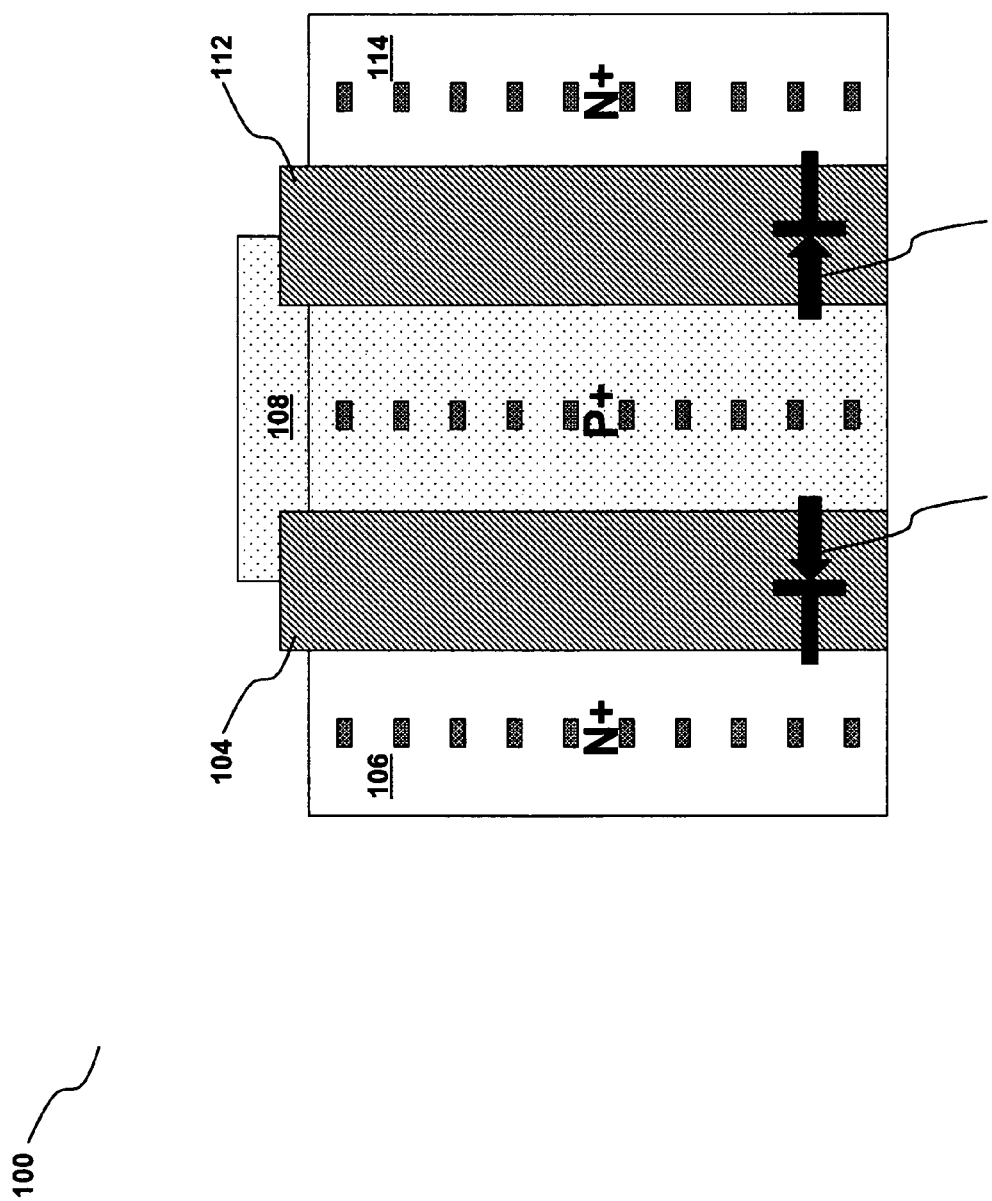
FIG. 1 illustrates a layout structure of a conventional diode.

FIG. 1 illustrates a layout structure 100 for a set of conventional diodes constructed by SOI technology. Each of the conventional diodes within the layout structure 100 is made of an N+ and P+ doped regions interfacing with one another. For example, a diode 102 includes a poly-silicon layer 104 overlying an N+ doped region 106, and a P+ doped region 108, while another diode 110 includes a poly-silicon layer 112 overlying an N+ doped region 114, and a P+ doped region 108.

These diodes are typically used for on-chip ESD protection due to their low trigger voltage, low turn-on resistance, and high ESD robustness. However, these conventional diodes, when being used alone for ESD protection without other devices, do not provide adequate protection against ESD charges.

Figure 2:
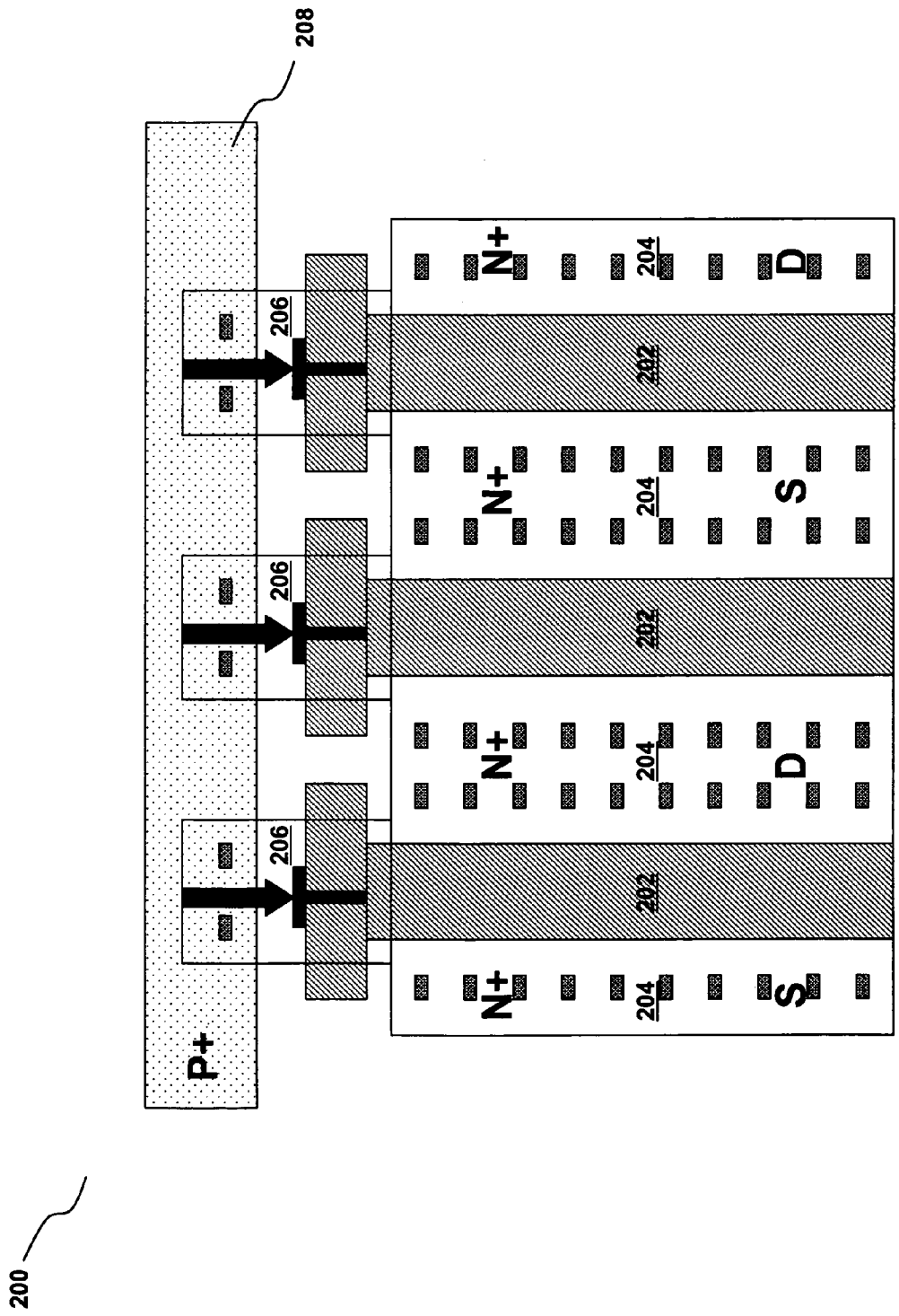
FIG. 2 illustrates a layout structure of a conventional T-gate GGNMOS device.

FIG. 2 illustrates a layout structure 200 for a set of conventional T-gate GGNMOS devices constructed by SOI technology. Each of the conventional T-gate transistors within the layout structure 200 includes a poly-gate layer 202 with N+ source/drain regions 204 formed on both sides thereof. The poly-gate layer 202 has a T-shaped configuration. A P+ doped region 208 is formed as a well-contact for wells that are implemented under the N+ source/drain regions 204.

The T-gate GGNMOS device, when being used alone for ESD protection, does not provide efficient protection against negative ESD charges. Thus, it is desired to have an ESD protection circuit that can better protect core circuits against negative ESD charges.

Figure 3:
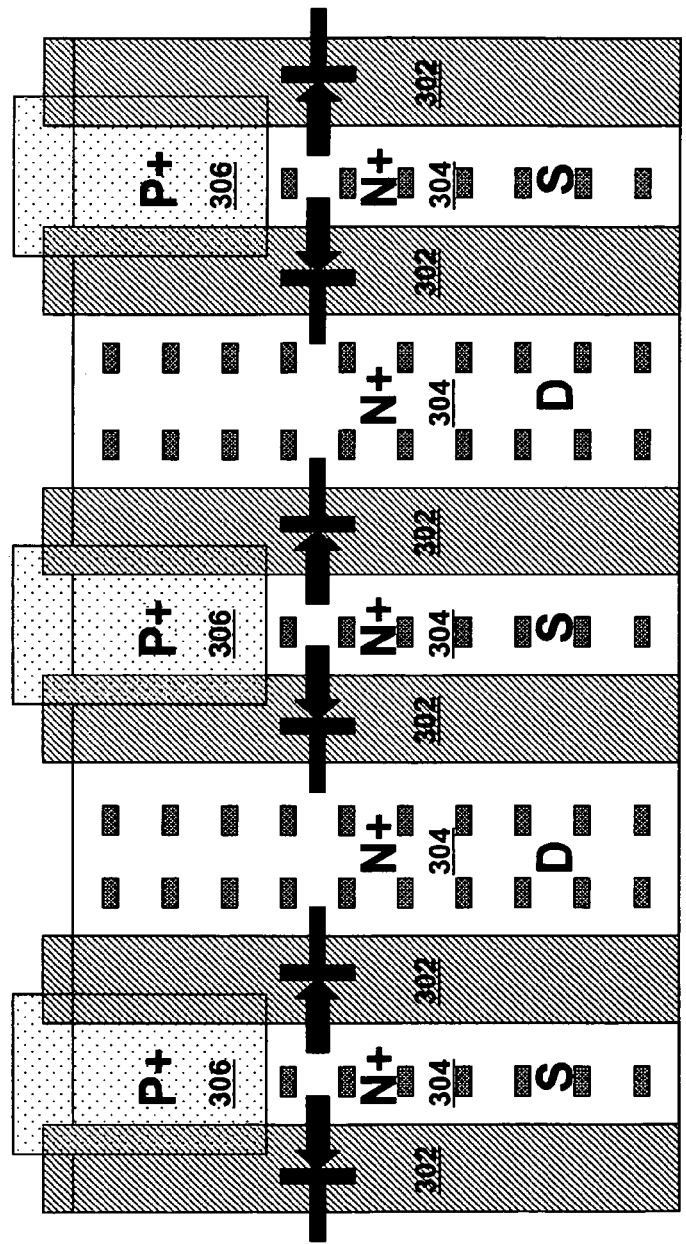
FIG. 3 illustrates a layout structure of an ESD protection circuit in accordance with one embodiment of the present invention.

FIG. 3 illustrates a layout structure 300 used for making an ESD protection device in accordance with one embodiment of the present invention. The layout structure 300 includes a number of NMOS device areas, each of which includes a gate conductive layer 302, and source/drain doped regions 304 disposed at two sides of the gate conductive layer 302. The gate conductive layer 302 can be made of a material, such as metal, polysilicon, and polycide. The source/drain regions 304 are constructed by heavily doping N-type impurities into a P-type semiconductor substrate underlying the gate conductive layer 302. The region underlying the gate conductive layer 302 and between the source/drain regions 304 is defined as a channel region that conducts when it is turned on. As it is understood by people skilled in the art, the dopant density of the channel region is lower than that of the source/drain region 304.

A P-type doped region 306 is disposed along and interfaces with the source region 304 at one side of the conductive gate layer 302 for each NMOS device area. The P-type doped region 306 and the gate conductive layer 302 overlap partially at their edges for improving the conductivity therebetween. The P-type doped region 306 can extend beyond a boundary of the source region 304. Although FIG. 3 shows a P-type doped region 306 at the upper side of the source region 304, it can be disposed at the lower side of the source region 304, or both. Since the polarities of the doped region 306 and the drain region 304 are different, they can form a diode within the NMOS device area, without occupying extra space.

As shown in FIG. 3, a number of MOS device areas, each of which has a gate conductive layer 302 and source/drain regions 304, are arranged in the layout structure 300. In one embodiment of the present invention, the P-type doped region 306 is disposed between two neighboring gate conductive layers 302, and overlap with them at their edges. As such, one P-type doped region 306 can form a diode with the drain region 304 across one gate conductive layer 302 to its right, and another diode with the drain region 304 across another gate conductive layer 304 to its left.

The MOS device area (including the gate conductive layer 302 and source/drain regions 304) and the P-type doped region 306 are constructed on a semiconductor layer that is separated from a semiconductor substrate by an insulation layer. This is the so-called SOI structure. The P-type doped region 306 has a dopant density higher than that of the channel region underlying the gate conductive layer 302. For example, the dopant density of the P-type doped region 306 can be substantially the same as that of the source/drain region 304. Specifically, the dopant density of the P-type doped region 306 ranges approximately from 1e6/cm3 to 1e24/cm3. It is understood that increasing the size and dopant density of the P-type doped region 306 leads to an increase of current passing through the diode constructed by regions 306 and 304.

Figure 4:
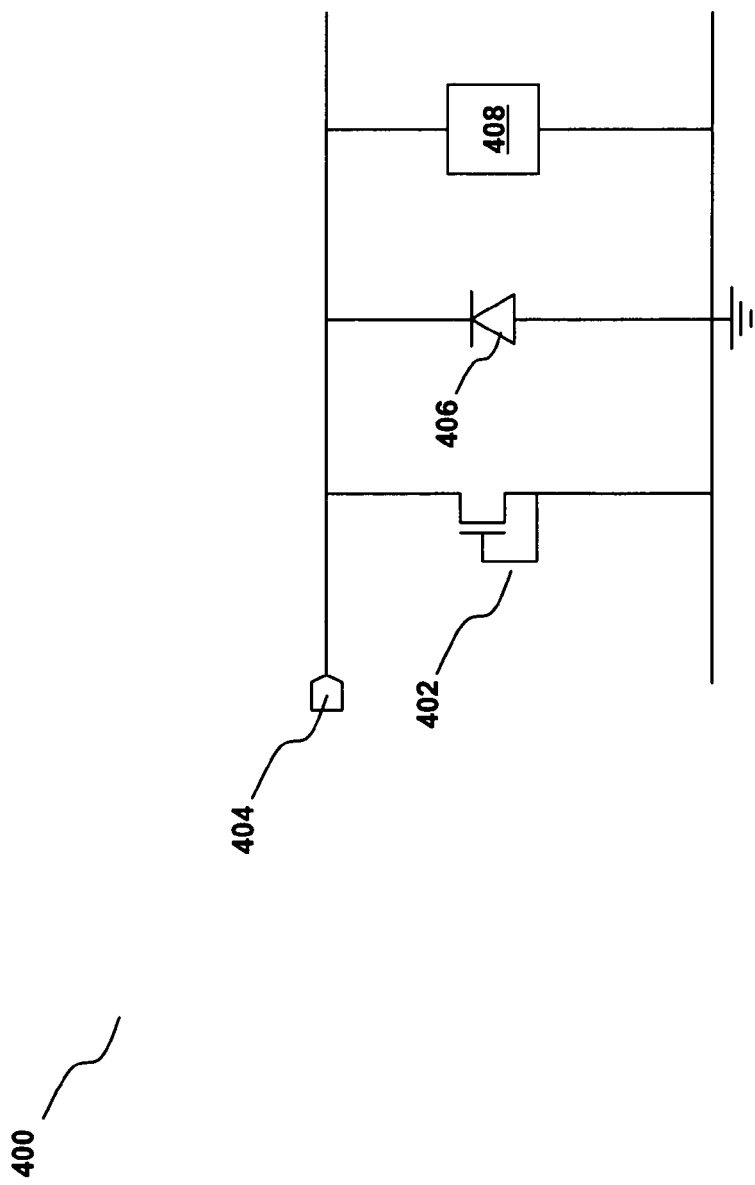
FIG. 4 schematically illustrates the ESD protection circuit in accordance with one embodiment of the present invention.

The conductive gate layer 302, source region 304, and P-type doped region 306 are connected to ground, and the drain region 304 is connected to an input/output pad. This configuration can be schematically illustrated as a diagram 400 in FIG. 4. An NMOS transistor 402 representing the electronic symbol of the MOS device area discussed above is connected between a pad 404 and ground. A diode 406 representing the electronic symbol of the diode formed by the P-type doped region 306 and drain region 304 in FIG. 3 is also connected between the pad 404 and ground in parallel with the NMOS transistor 402. A core circuit 408 is coupled between the pad 404 and ground in parallel with the NMOS transistor 402 and diode 406. The NMOS transistor 402 is normally turned off because its gate and source are connected to ground. The diode 404 is reversely connected between pad 404 and ground. Thus, in normal operation, the NMOS transistor 402 and diode 406 will not affect the operation of the core circuit 408. However, during an ESD event, the NMOS transistor 402 and/or the diode 406 can be triggered on to dissipate the ESD charges.

Figure 5:
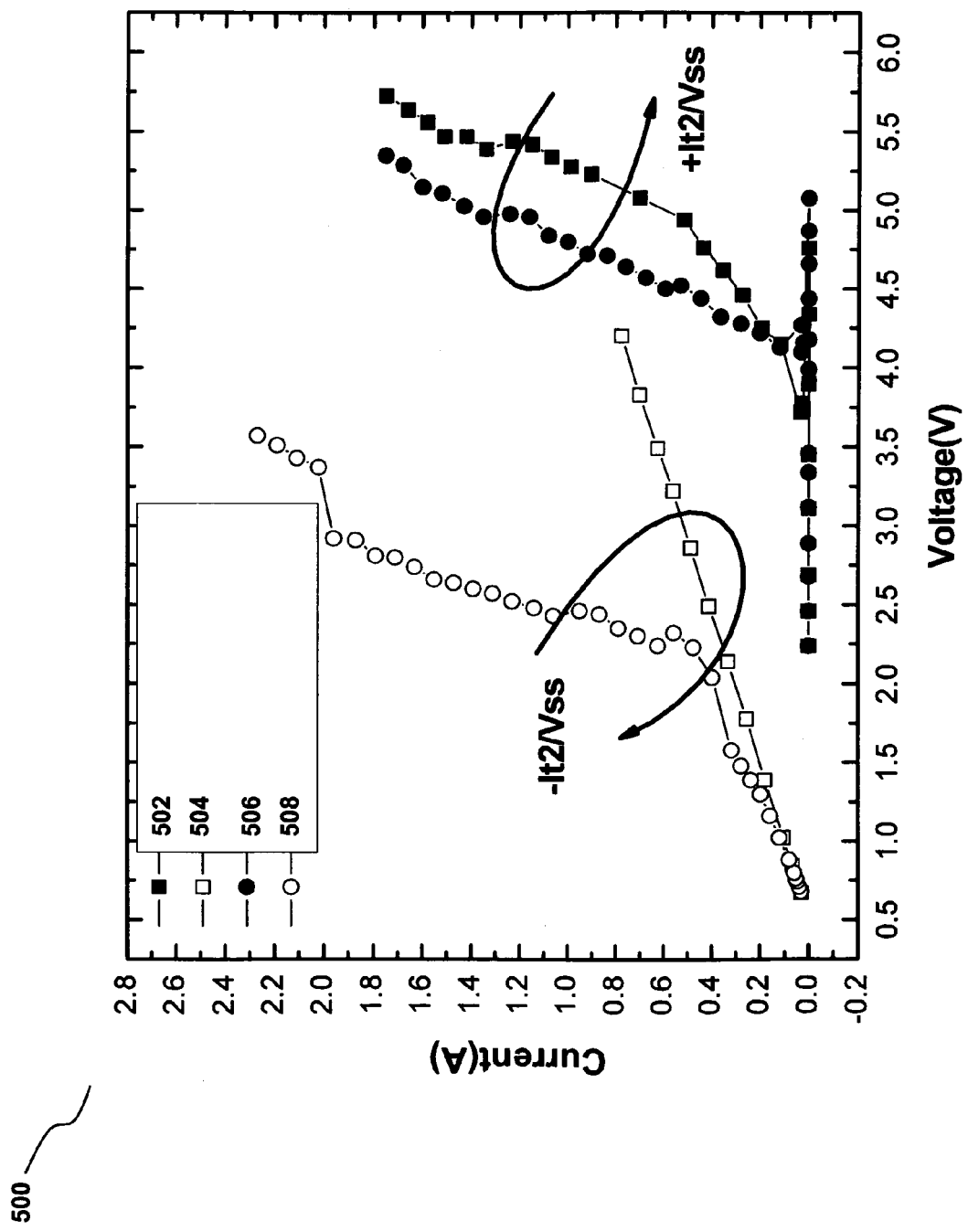
FIG. 5 illustrates a graph showing the improved performance of the proposed ESD protection circuit during a negative ESD event.

FIG. 5 illustrates a graph 500 comparing the test results regarding the ESD protection capability of the proposed ESD protection as shown in FIG. 3 and the conventional ESD protection as shown in FIG. 2. Both devices are designed to have the same total width. A curve 502 is used to represent the positive ESD performance of the conventional ESD protection device of FIG. 2, while another curve 504 is used to represent the negative ESD performance of the conventional ESD protection device of FIG. 2. For the proposed ESD protection device of FIG. 3, a curve 506 is used to represent its positive ESD performance while another curve 508 is used to represent its negative ESD performance.

For positive ESD performances, both devices provided similar levels of protection of 1.75 A. For negative ESD performance, the conventional ESD protection device of FIG. 2 only provided protection up to −0.86 A while the proposed ESD protection device of FIG. 3 provided protection up to −2.27 A, which is a significant improvement.

As discussed above, the proposed layout structure for the ESD protection device can increase the size of the diode without using additional space. This helps the ESD protection device dissipate ESD current during a negative ESD event.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A layout structure for an electrostatic discharge (ESD) protection circuit, comprising:
a first MOS device area having a first and second doped regions of the same polarity disposed at two sides of a first conductive gate layer; and
a third doped region disposed along and interfaces with the first doped region at one side of the first conductive gate layer, wherein the first conductive gate layer, first and third doped regions are connected to ground, and the second doped region is connected to an input/output pad, and
wherein the third doped region has a polarity different from that of the first and second doped regions, such that the third doped region and the second doped region form a diode for enhancing dissipation of ESD current during a negative ESD event.

2. The layout structure of claim 1, wherein the first conductive gate layer and the third doped region overlap partially at their edges.

3. The layout structure of claim 1, wherein the third doped region extends beyond a boundary of the first doped region.

4. The layout structure of claim 1, wherein the first and second doped regions are N-type, and the third doped region is P-type.

5. The layout structure of claim 1, wherein the third doped region has a dopant density substantially the same as that of the first or second doped region.

6. The layout structure of claim 1, wherein the third doped region has a dopant density higher than that of a channel region underlying the first gate conductive layer.

7. The layout structure of claim 6, wherein the dopant density of the third doped region ranges approximately from 1e6/cm3 to 1e24/cm3.

8. The layout structure of claim 1, wherein the first MOS device area and the third doped region are constructed on a semiconductor layer that is separated from a semiconductor substrate by an insulation layer.

9. The layout structure of claim 1, further comprising a second MOS device area having a second conductive gate layer adjacent to the first doped region, and a fourth doped region adjacent to the second conductive gate layer at an opposite side to the first doped region, the first and fourth doped regions having the same polarity.

10. The layout structure of claim 9, wherein the third doped region and the second conductive gate layer overlap partially at their edges.

11. A layout structure for an electrostatic discharge (ESD) protection circuit, comprising:
   a first NMOS device area having an N-type source and drain regions disposed at two sides of a first conductive gate layer; and
   a P-type doped region disposed along and interfaces with the N-type source region at one side of the first conductive gate layer, such that the P-type doped region and the N-type drain region form a diode for enhancing dissipation of an ESD current during a negative ESD event, wherein the first conductive gate layer, N-type source and P-type doped regions are connected to ground, and the N-type drain region is connected to an input/output pad, and
   wherein the first MOS device area and the P-type doped region are constructed on a semiconductor layer that is separated from a semiconductor substrate by an insulation layer.

12. The layout structure of claim 11, wherein the first conductive gate layer and the P-type doped region overlap partially at their edges.

13. The layout structure of claim 11, wherein the dopant density of the P-type doped region ranges approximately from 1e6/cm3 to 1e24/cm3.

14. A layout structure for an electrostatic discharge (ESD) protection circuit, comprising:
   a first NMOS device area having a first N-type source and drain regions disposed at two sides of a first conductive gate layer;
   a P-type doped region disposed along and interfaces with the first N-type source region at one side of the first conductive gate layer, such that the P-type doped region and the first N-type drain region form a first diode, wherein the first conductive gate layer, first N-type source and P-type doped regions are connected to ground, and the first N-type drain region is connected to an input/output pad, and; and
   a second NMOS device area having a second conductive gate layer adjacent to the first N-type source region, and a second N-type drain region adjacent to the second conductive gate layer at an opposite side to the first N-type source region, such that the second N-type drain region and the P-type doped region form a second diode.

15. The layout structure of claim 14, wherein the second conductive gate layer, the first N-type source region and the P-type doped region are connected to the ground, and the second N-type drain region are connected to an input/output pad.

16. The layout structure of claim 14, wherein the first conductive gate layer and the P-type doped region overlap partially at their edges, and the second conductive gate layer and the P-type doped region overlap partially at their edges.

17. The layout structure of claim 14, wherein the dopant density of the P-type doped region ranges approximately from 1e6/cm3 to 1e24/cm3.

18. The layout structure of claim 14, wherein the first and second MOS device areas, and the P-type doped region are constructed on a semiconductor layer that is separated from a semiconductor substrate by an insulation layer.

\* \* \* \* \*